(12) United States Patent
Kim et al.

(10) Patent No.: US 8,803,587 B2
(45) Date of Patent: Aug. 12, 2014

(54) RESISTOR-SHARING SWITCHING CIRCUIT

(75) Inventors: Yu Sin Kim, Gyeonggi-do (KR); Sung Hwan Park, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/532,554

(22) Filed: Jun. 25, 2012

(65) Prior Publication Data

US 2013/0015903 A1 Jan. 17, 2013

(30) Foreign Application Priority Data

Jul. 13, 2011 (KR) ........................ 10-2011-0069529

(51) Int. Cl.
*H03K 17/687* (2006.01)

(52) U.S. Cl.
USPC ............ 327/427; 327/403; 327/376; 327/377

(58) Field of Classification Search
USPC ........................................................ 327/427
See application file for complete search history.

(56) References Cited

U.S. PATENT DOCUMENTS

| | | | | |
|---|---|---|---|---|
| 6,069,500 A | * | 5/2000 | Kao | 327/77 |
| 6,069,503 A | * | 5/2000 | Doyle | 327/103 |
| 6,803,680 B2 | * | 10/2004 | Brindle et al. | 307/115 |
| 6,882,829 B2 | * | 4/2005 | Mostov et al. | 455/83 |
| 7,663,944 B2 | * | 2/2010 | Lee | 365/194 |
| 2003/0190895 A1 | | 10/2003 | Mostov et al. | |
| 2010/0039160 A1 | * | 2/2010 | Ilkov | 327/374 |
| 2010/0225378 A1 | * | 9/2010 | Nakatsuka et al. | 327/434 |

FOREIGN PATENT DOCUMENTS

| | | |
|---|---|---|
| JP | 11-154804 | 6/1999 |
| JP | 2009-124653 | 6/2009 |
| JP | 2010-233207 A | 10/2010 |

* cited by examiner

*Primary Examiner* — Lincoln Donovan
*Assistant Examiner* — Patrick Chen
(74) *Attorney, Agent, or Firm* — Bracewell & Giuliani LLP; Brad Y. Chin

(57) ABSTRACT

Disclosed herein is a resistor-sharing switching circuit, including: a first switching element turning on/off between a first input and output terminal and a second input and output terminal; a second switching element turning on/off between the first input and output terminal and a third input and output terminal; a signal transmission unit connected to both a control terminal of the first switching element and a control terminal of the second switching element; and a resistor having one end connected to the signal transmission unit and the other end connected to a control signal input terminal.

5 Claims, 2 Drawing Sheets

- PRIOR ART -

100

RESISTOR-SHARING SWITCHING CIRCUIT

CROSS REFERENCE(S) TO RELATED APPLICATIONS

This application claims the benefit under 35 U.S.C. Section 119 of Korean Patent Application Serial No. 10-2011-0069529, entitled "Resistor-Sharing Switching Circuit" filed on Jul. 13, 2011, which is hereby incorporated by reference in its entirety into this application.

BACKGROUND OF THE INVENTION

1. Technical Field

The present invention relates to a resistor-sharing switching circuit.

2. Description of the Related Art

FIG. 1 is a view for exemplifying a general RF switching circuit.

Referring to FIG. 1, switching elements are provided between a transmitting terminal and an antenna and between a receiving terminal and the antenna, and connect the transmitting terminal and the receiving terminal to the antenna alternatively in response to a control signal. Here, a resistor is provided at a control terminal of the switching element in order to allow the control signal to be applied to the control terminal of the switching element.

While a signal transmitted from the transmitting terminal to the antenna and/or a signal transmitted from the antenna to the receiving terminal has a significantly large power, a threshold voltage of a switching element, such as a transistor used in an RF switching circuit, generally has a relatively low power. Therefore, a plurality of transistors are connected in series between the transmitting terminal and/or the receiving terminal and the antenna. When the plurality of transistors are connected in series like this, the number of resistors connected to control terminals of respective transistors is increased.

Meanwhile, when the RF switching circuit is generally realized as a chip, the transistors, which constitute the switching element, and the resistors, which are connected to the control terminals of the transistors, occupy a very large portion in the chip where the RF switching circuit is embodied. For example, in a case of a single-pole-double-throw (SPDT) RF switching circuit, an area occupied by the resistors connected to the control terminals of the switching element reaches about 10% of the total area of the chip.

Recently, in a situation where small size and weight of various kinds of electronic devices are issued, efforts to decrease the size of the chip have continued. However, there is a limit to miniaturize the chip without decreasing the number of transistors and the number of resistors connected to the control terminals of the transistors in the RF switching circuit.

SUMMARY OF THE INVENTION

An object of the present invention is to provide a resistor-sharing switching circuit capable of miniaturizing a circuit by decreasing the number of resistors used therein.

According to an exemplary embodiment of the present invention, there is provided a resistor-sharing switching circuit, including: a first switching element turning on/off between a first input and output terminal and a second input and output terminal; a second switching element turning on/off between the first input and output terminal and a third input and output terminal; a signal transmission unit connected to both a control terminal of the first switching element and a control terminal of the second switching element; and a resistor having one end connected to the signal transmission unit and the other end connected to a control signal input terminal.

The signal transmission unit may include: a first transmission unit connected between the first switching element and the resistor, and having a first switch and an inverter connected in parallel; and a second transmission unit connected between the second switching element and the resistor and having a second switch and an inverter connected in parallel.

A control signal for turning on/off the first switching element may be inputted to the first switch, and a control signal for turning on/off the second switching element may be inputted to the second switch.

A control signal for turning on the first switching element may be applied to the control signal input terminal and the first switch at the same time, and a control signal for turning on the second switching element may be applied to the control signal input terminal and the second switch at the same time.

The first input and output terminal may be an antenna.

The first input and output terminal may be an antenna, the second input and output terminal maybe a transmitting terminal, and the third input and output terminal may be a receiving terminal.

The first switching element and the second switching element each may be composed of a plurality of transistors connected in series and the signal transmission units and the resistors may be provided in the same number as the transistors constituting the first switching element or the second switching element, control terminals of the transistors being connected to the signal transmission units, respectively.

At least one of the signal transmission units may be connected to a control terminal of one transistor included in the first switching element and a control terminal of one transistor included in the second switching element.

The resistor may be at least one transistor.

DESCRIPTION OF THE PREFERRED EMBODIMENTS

Figure 1:
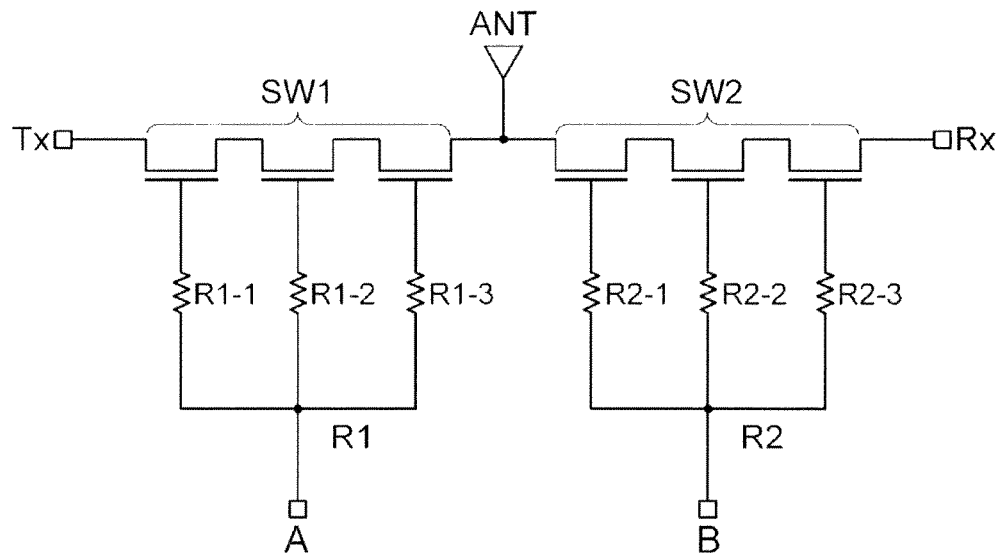
FIG. 1 is a view for schematically exemplifying a general switching circuit of the related art.

Various advantages and features of the present invention and techniques accomplishing thereof will become apparent from the following description of the embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals denote like elements throughout specification.

Terms used in the present specification are for explaining the embodiments rather than limiting the present invention. Unless explicitly described to the contrary, a singular form includes a plural form in the present specification. The word "comprise" and variations such as "comprises" and/or "comprising," will be understood to imply the inclusion of stated constituents, steps, operations and/or elements but not the exclusion of any other constituents, steps, operations and/or elements.

Hereinafter, a configuration and an operation of the present invention will be described in detail with reference to the accompanying drawings.

Figure 2:
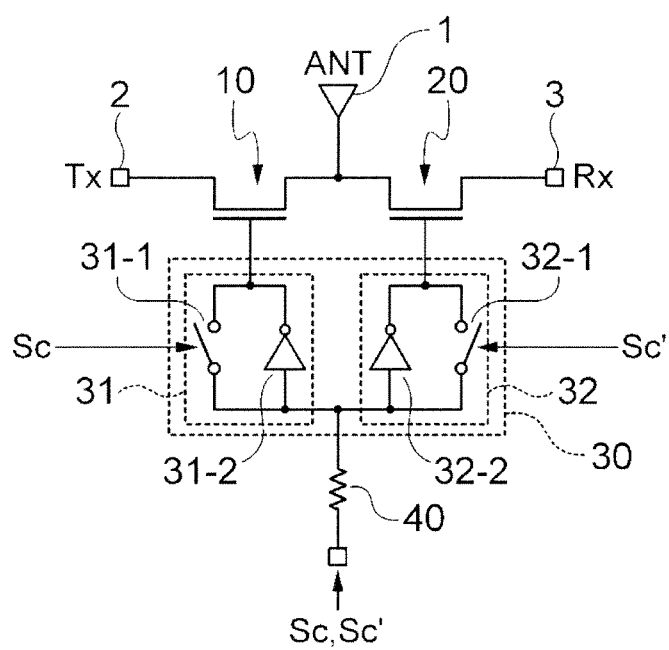
FIG. 2 is a view for schematically exemplifying a resistor-sharing switching circuit according to one exemplary embodiment of the present invention.

FIG. 2 is a view for schematically exemplifying a resistor-sharing switching circuit according to one exemplary embodiment of the present invention.

Referring to FIG. 2, a resistor-sharing switching circuit 100 according to one exemplary embodiment of the present invention may include a first input and output terminal 1, a second input and output terminal 2, a third input and output terminal 3, a signal transmission unit 30, a resistor 40, and a control signal input terminal.

Here, the first input and output terminal 1 and the second input and output terminal 2 may be connected to each other or disconnected from each other by the first switching element 10, and the first input and output terminal 1 and the third input and output terminal 3 may be connected to each other or disconnected from each other by the second switching element 20.

Meanwhile, the first input and output terminal 1 maybe an antenna, and the second input and output terminal 2 may be a transmitting terminal, and the third input and output terminal 3 may be a receiving terminal.

The signal transmission unit 30 may have one end connected to both a control terminal of the first switching element 10 and a control terminal of the second switching element 20, and the other end connected to the resistor 40.

Accordingly, a control signal applied to the control signal input terminal can be applied to the first switching element 10 and the second switching element 20 through the resistor 40, and thus, the resistor 40 can be connected to and shared with the control terminals of the first switching element 10 and the second switching element 20. Therefore, the number of resistors can be decreased by half, as compared with the switching circuit of the related art.

Meanwhile, as shown in FIG. 2, the signal transmission unit 30 may include a first transmission unit 31 and a second transmission unit 32. The first signal transmission unit 31 is connected between the first switching element 10 and the resistor 40 and has a first switch 31-1 and an inverter 31-2 connected in parallel. The second signal transmission unit 32 is connected between the second switching element 20 and the resistor 40 and has a second switch 32-1 and an inverter 32-2 connected in parallel.

Here, a control signal for turning on/off the first switching element 10 may be inputted to the first switch 31-1, and a control signal for turning on/off the second switching element 20 may be inputted to the second switch 32-1.

The control signal for turning on the first switching element 10 may be applied to the control signal input terminal and the first switch 31-1 at the same time, and the control signal for turning on the second switching element 20 may be applied to the control signal input terminal and the second switch 32-1 at the some time.

For example, when a control signal Sc for turning on the first switching element 10 is applied to the control signal input terminal and the first switch 31-1, an on-signal is transmitted to the first switching element 10 through the first switch 31-1 of the first transmission unit 31, and thus, the first switching element 10 is in an ON state.

Here, since the second switch 32-1 of the second transmission unit 32 is in an OFF state, a signal inverted by the second inverter 32-2 is transmitted to the control terminal of the second switching element 20, and thus, the second switching element 20 is in an OFF state.

On the contrary, when a control signal Sc' for turning on the second switching element 20 is applied to the control signal input terminal and the second switch 32-1, an on-signal is transmitted to the second switching element 20 through the second switch 32-1 of the second transmission unit 32, and thus, the second switching element 20 can be in an ON state.

Here, since the first switch 31-1 of the first signal transmission unit 31 is in an OFF state, a signal inverted by the first inverter 32-1 is transmitted to the control terminal of the first switching element 10, and thus, the first switching element 10 is in an OFF state.

Therefore, as for the resistor-sharing switching circuit according to one exemplary embodiment of the present invention, ON/OFF of the first switching element 10 may be controlled in response to the signal for controlling the first switching element 10 and ON/OFF of the second switching element 20 may be controlled in response to the signal for controlling the second switching element 20 while the resistor 40 is shared by the switching elements provided at different input and output terminals. That is to say, the first switching element 10 and the second switching element 20 may be controlled to be alternately turned on/off in response to the signals for controlling the first switching element 10 and the second switching element 20.

Meanwhile, since a transistor may function as a kind of resistor in a circuit when applied current and voltage are determined, the resistor 40 maybe embodied by using the transistor. When the resistor 40 is embodied by the transistor like this, the transistor can be utilized as a kind of variable resistor 40 by controlling voltage and current applied to the transistor.

Figure 3:
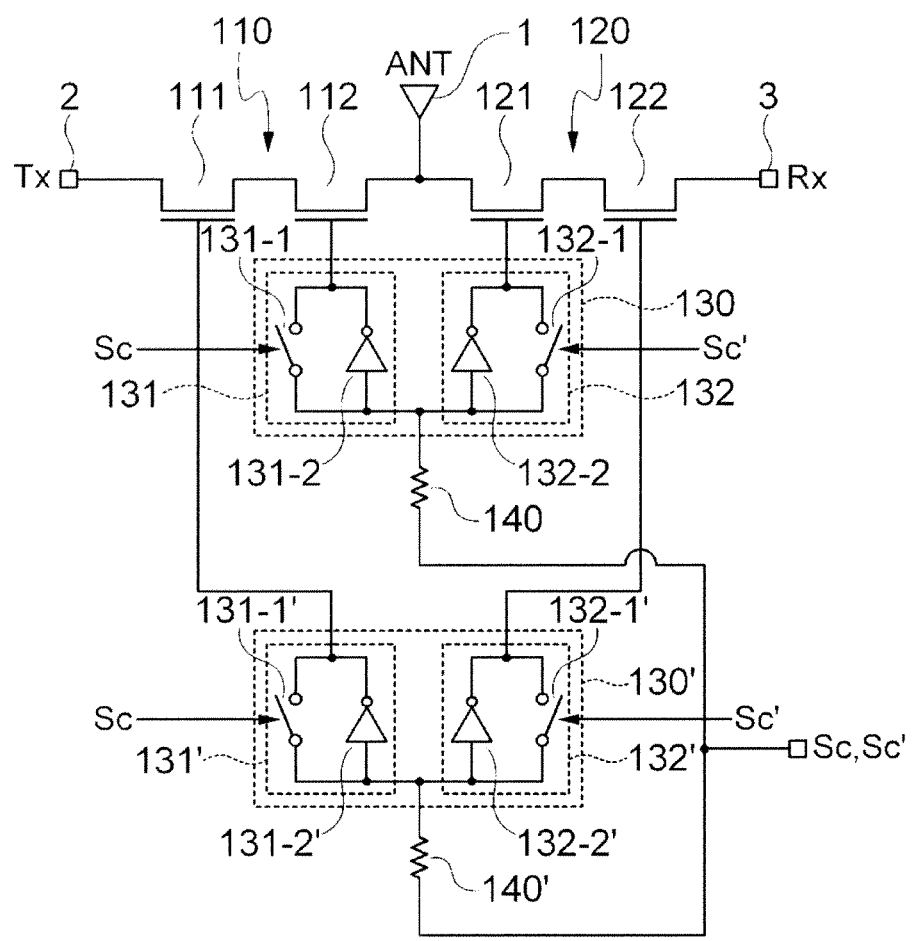
FIG. 3 is a view for schematically exemplifying a resistor-sharing switching circuit according to another exemplary embodiment of the present invention.

FIG. 3 is a view for schematically exemplifying a resistor-sharing switching circuit according to another exemplary embodiment of the present invention.

Hereinafter, the present exemplary embodiment will be described based on a difference with the exemplary embodiment in FIG. 2, with reference with FIG. 3.

A first switching element 110 and a second switching element 120 may be embodied by using various kinds of transistors 111, 112, 121, and 122. Here, the switching elements 110 and 120 may be embodied by connecting in series a plurality of transistors, considering levels of signals transmitted through the first switching element 110 and the second switching element 120 and threshold voltages of the transistors.

For example, when a signal transmitted from a transmitting terminal Tx to an antenna ANT is 30V and each threshold voltage of the transistors 111 and 112 embodying the first switching element 110 is 3V, the first switching element 110 needs to be embodied by connecting in series at least ten transistors in order to prevent deterioration of the transistors caused by the signal transmitted from the transmitting terminal Tx to the antenna ANT and allow the transistors to be normally operated.

Meanwhile, the signal transmission units 130 and 130' and the resistors 140 and 140' may be provided in the same number as the transistors constituting the first switching elements 110 or the second switching elements 120, and the control terminals of the transistors may be connected to the signal transmission units, respectively.

Here, at least one of the signal transmission units 130 and 130' may be connected to the control terminal of one of the transistors 111 and 112 included in the first switching element 110 and the control terminal of one of the transistors 121 and 122 included in the second switching element 120.

As shown in FIG. 3, when the number of transistors constituting the first switching element 110 and the second switching element 120 each is two, the signal transmission units and the resistors each may be provided in two.

Here, for convenience of explanation, two signal transmission units and two resistors are distinguished as a first signal transmission unit 130 and a second signal transmission unit 130', and a first resistor 140 and a second resistor 140', respectively.

For example, when a control signal Sc for turning on the first switching element 110 is applied to the control signal input terminal, a first switch 131-1 of the first signal transmission unit 130 and a first switch 131-1' of the second signal transmission unit 130', an on signal is transmitted to the control terminals of the transistors 111 and 112 constituting the first switching element 110 through the first switches 131-1 and 131-1', and thus, the first switching element 110 is in an ON state.

Here, since the second switches 132-1 and 132-1' of the first signal transmission unit 130 and the second signal transmission unit 130' are in an OFF state, a signal inverted by the second inverters 132-2 and 132-2' is transmitted to the control terminals of the transistors 121 and 122 constituting the second switching element 120, and thus, the second switching element 120 is in an OFF state.

Contrary to this, when a control signal Sc' for turning on the second switching element 120 is applied to the control signal input terminal, a second switch 132-1 of the first signal transmission unit 130 and a second switch 132-1' of the second signal transmission unit 130', an on signal is transmitted to the control terminals of the transistors 121 and 122 constituting the second switching element 120 through the second switches 132-1 and 132-1', and thus, the second switching element 120 is in an ON state.

Here, since the first switches 131-1 and 131-1' of the first signal transmission unit 130 and the second signal transmission unit 130' are in an OFF state, a signal inverted by the first inverters 131-2 and 131-2' is transmitted to the control terminals of the transistors 111 and 112 constituting the first switching element 110, and thus, the first switching element 110 is in an OFF state.

Therefore, as for the resistor-sharing switching circuit 200 according to another exemplary embodiment of the present invention, in which the switching element is embodied by using a plurality of transistors, ON/OFF of the first switching element 110 may be controlled by the signal for controlling the first switching element 110 and ON/OFF of the second switching element 120 may be controlled by the signal for controlling the second switching element 120 while the resistor is shared by the switching elements provided at different input and output terminals. That is to say, the first switching element 110 and the second switching element 120 may be controlled to be alternately turned on/off in response to the signals for controlling the first switching element 110 and the second switching element 120.

In addition, in the resistor-sharing switching circuit according to the present invention, the number of resistors connected to the control terminals of the switching elements can be decreased to ½ in SPDT, ⅓ in SP3T, and ¼ in SP4T, and thus, the total size of the RF switching circuit can be reduced by at least 5%.

As set forth above, the resistor-sharing switching circuit according to the present invention can have useful effects in that the number of resistors needed to be provided in a chip is decreased by half, and thus the size of the chip can be reduced, as compared with the switching circuit of the related art.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A resistor-sharing switching circuit, comprising:
a first switching element turning on/off according to a first control signal;
a second switching element turning on/off according to a second control signal;
a signal transmission unit including a first transmission unit of which one end is connected to a control terminal of the first switching element and a second transmission unit of which one end is connected to a control terminal of the second switching element; and
a resistor having one end connected to the other end of the first transmission unit and the second transmission unit, and the other end or the resistor connected to a control signal input terminal receiving the first control signal and the second control signal,
wherein the first transmission unit includes
a first switch turning on/off according to the first control signal and a first inverter connected to the first switch in parallel and
wherein the second transmission unit includes
a second switch turning on/off according to the second control signal and a second inverter connected to the second switch in parallel.

2. The resistor-sharing switching circuit according to claim 1, wherein a first input and output terminal is an antenna.

3. The resistor-sharing switching circuit according to claim 1, wherein a first input and output terminal is an antenna, a second input and output terminal is a transmitting terminal, and a third input and output terminal is a receiving terminal.

4. The resistor-sharing switching circuit according to claim 1, wherein the first switching element and the second switching element each are composed of a plurality of transistors connected in series and the signal transmission units and the resistors are provided in the same number as the transistors constituting the first switching element or the second switching element, control terminals of the transistors being connected to the signal transmission units, respectively.

5. The resistor-sharing switching circuit according to claim 4, wherein herein at least one of the signal transmission units is connected to a control terminal of one transistor included in the first switching element and a control terminal of one transistor included in the second switching element.

\* \* \* \* \*